United States Patent [19]
Sasaki

[11] Patent Number: 5,418,740
[45] Date of Patent: May 23, 1995

[54] SEMICONDUCTOR MEMORY APPARATUS FORMED OF A PLURALITY OF SMALL MEMORY CELLS ARRAYS HAVING COLUMNS OF MEMORY CELLS CONNECTED TO COLUMN SELECTION WORD LINES THROUGH SELECTION TRANSISTORS

[75] Inventor: Masayoshi Sasaki, Tokyo, Japan

[73] Assignee: Sony Corporation, Tokyo, Japan

[21] Appl. No.: 217,856

[22] Filed: Mar. 25, 1994

[30] Foreign Application Priority Data

Mar. 26, 1993 [JP] Japan .................................. 5-092546
Oct. 15, 1993 [JP] Japan .................................. 5-281988

[51] Int. Cl.⁶ .............................................. G11C 7/00
[52] U.S. Cl. ................................ 365/154; 365/190; 365/230.04
[58] Field of Search .................... 365/154, 156, 51, 63, 365/72, 190, 230.03, 230.04

[56] References Cited

U.S. PATENT DOCUMENTS 5,287,323 2/1994 Takahashi ...................... 365/154 X Primary Examiner—Joseph A. Popek
Assistant Examiner—Son Mai
Attorney, Agent, or Firm—Hill, Steadman & Simpson

[57] ABSTRACT

A memory cell array is divided into a plurality of row sections in a column direction, and one main bit line is arranged between two adjacent columns. One pair of sub bit lines are arranged for each column of the row sections, and the pair of sub bit lines are connected to main bit lines exclusively of sub bit lines which are adjacent to the pair of sub bit lines in columns on both sides of the pair of bit lines. For this reason, the pitch of main bit lines can be set to be almost twice that of conventional main bit lines. Therefore, the time required for the charging/discharging operations of the bit lines can be shortened to increase the operating speed, reliability can be improved, and a yield can be increased.

8 Claims, 8 Drawing Sheets

SEMICONDUCTOR MEMORY APPARATUS FORMED OF A PLURALITY OF SMALL MEMORY CELLS ARRAYS HAVING COLUMNS OF MEMORY CELLS CONNECTED TO COLUMN SELECTION WORD LINES THROUGH SELECTION TRANSISTORS

BACKGROUND OF THE INVENTION

1. Field of the Invention

The present invention relates to a semiconductor memory apparatus called an SRAM.

2. Description of the Related Art

FIG. 1 shows the related art of a SRAM having a ×4-bit arrangement. In this related art, a plurality of memory cells $MC_0$, $MC_1$, ... are arranged in row and column directions to constitute a memory cell array MCA. Word lines $W_0$, $W_1$, ... serving as output lines extending from a row address decoder RAD are used as the gate electrodes of a pair of transfer transistors in each of the memory cells $MC_0$, $MC_1$, ... in each row.

A pair of true and complementary bit lines $B_0$, $B_0'$, ... are respectively connected to the pair of transfer transistors in each of the memory cells $MC_0$, $MC_1$, ... in each column, and output lines extending from a column address decoder CAD are connected to column gates $CG_0$, $CG_1$, ... of the pairs of bit lines $B_0$, $B_0'$, ... The terminals of the pairs of bit lines $B_0$, $B_0'$, ... are connected to sense amplifiers $SA_0$, $SA_1$, ..., and four sense amplifiers $SA_0$ to $SA_3$, ... constituting a set are connected to input/output terminals $I/O_0$ to $I/O_3$, respectively.

Note that since the word lines $W_0$, $W_1$, ... serve as the gate electrodes of the transfer transistors in the memory cells $MC_0$, $MC_1$, ... as described above, the word lines $W_0$, $W_1$, ... are formed by a first polysilicon layer on a semiconductor substrate. The bit lines, $B_0$, $B_0'$, ... generally consist of an Al-based alloy.

Although the speed performance of the SRAM is determined by several factors, a main factor is a time required for the charging/discharging operations of the bit lines $B_0$, $B_0'$, .... In order to shorten this time, the capacitance and resistance of the bit lines $B_0$, $B_0'$, ... must be reduced.

For this purpose, the bit lines $B_0$, $B_0'$, ... are comprised of an Al-based alloy as described above to decrease the resistance. At the same time, as shown in FIG. 2, the thickness of an interlayer insulator 2 between the bit lines $B_0$, $B_0'$, ... and a polysilicon wiring layer 1 thereunder and the thickness of an interlayer insulator 4 between the bit lines $B_0$, $B_0'$, ... and a second Al wiring layer 3 thereon are increased as large as possible to decrease capacitances $C_1$ and $C_2$ of the bit lines $B_0$, $B_0'$, ....

However, as the area of the memory cells $MC_0$, $MC_1$, ... is reduced, the pitch of the bit lines $B_0$, $B_0'$, ... become small. For example, in a 4-Mbit SRAM, when a wiring width is set to be 0.8 μm, and an interwiring space is set to be 0.8 μm, the pitch is about 1.6 μm. In a 16-Mbit SRAM, a wiring width and an interwiring space are reduced, and the pitch is decreased to about 1.1 μm.

When the interwiring space is decreased, a capacitance $C_3$ formed between the bit lines $B_0$, $B_0'$, ... which rarely poses a problem in a conventional technique cannot be neglected. In order to reduce the capacitance $C_3$, only the thickness of the bit lines $B_0$, $B_0'$, ... needs to be reduced. However, the resistance of the bit lines $B_0$, $B_0'$, ... is increased by reducing the thickness of the bit lines $B_0$, $B_0'$, .... Therefore, when the thickness of the bit lines $B_0$, $B_0'$, ... is reduced, the time required for the charging/discharging operations of the bit lines $B_0$, $B_0'$, ... cannot be shortened.

In each of the memory cells $MC_0$, $MC_1$, ..., as shown in FIG. 3, spaces for contact holes 5 are required for the bit lines $B_0$, $B_0'$,.... These spaces serve as one factor which determines the size of each of the memory cells $MC_0$, $MC_1$, ....

That is, when a minimum design rule is set to be F, and a processing margin is set to be f, the size of each of the memory cells $MC_0$, $MC_1$, ... in a direction perpendicular to the extending direction of the bit lines $B_0$, $B_0'$, ..., i.e., the short sides direction of each of the memory cells $MC_0$, $MC_1$, ... is defined as 4F +4f, and the size cannot be reduced to less than 4F+4f. In addition, in an Al wiring layer, the size F cannot be easily minimized because processing properties and reliability are degraded. This is an important factor which increases the size of each of the memory cells $MC_0$, $MC_1$, ....

OBJECT AND SUMMARY OF THE INVENTION

It is an object of the present invention to shorten a time required for the charging/discharging operations of bit lines of an SRAM to increase operation speed, improve reliability, and increase yield.

According to the present invention, a semiconductor memory apparatus having memory cells constituted by flip-flops and a memory cell array in which the plurality of memory cells are arranged in row and column directions is characterized in that the memory cell array is divided into a plurality of small memory cell arrays in the column direction, each main bit line is arranged between two adjacent columns of the memory cells along the plurality of small memory cell arrays, one pair of sub bit lines are arranged for each of the columns in the small memory cell arrays, and selection transistors for connecting the pair of sub bit lines to the main bit lines exclusively of two sub bit lines respectively adjacent to the pair of sub bit line and present in the two adjacent columns on both sides of the pair of sub bit lines is arranged.

According to the present invention, a semiconductor memory apparatus is characterized in that a pair of main bit lines on both the sides of a given column in which the one sub bit line connected to the main bit line is present are connected by selection signals to a sense amplifier corresponding to the given column.

According to the present invention, a semiconductor memory apparatus is characterized in that the main bit lines and the pair of sub bit lines are connected through the selection transistors at central portions of the pair of sub bit lines in a longitudinal direction.

According to the present invention, a semiconductor memory apparatus is characterized in that the main bit line consists of a material containing Al as a main component, the sub bit line consists of a material containing a refractory metal or its silicide as a main component.

According to the present invention, a semiconductor memory apparatus is characterized in that a word line extending in the row direction is selectively activated to select the memory cells, and the selection transistors in the small memory cell array in which the activated word line extends are set in a conductive state for a predetermined period of time continued after the word line is activated.

According to the present invention, a semiconductor memory apparatus is characterized in that the selection transistors are kept in a non-conductive state, and the selection transistors between the main bit lines and the pair of sub bit lines corresponding to the selected memory cells are set in a conductive state during activation of the word line.

According to the present invention, a semiconductor memory apparatus is characterized in that the selection transistors are kept in a conductive state, and the selection transistors between the main bit lines and the pair of sub bit lines corresponding to the non-selected memory cells are set in a non-conductive state during activation of the word line.

In the semiconductor memory apparatus according to the present invention, almost one of the main bit lines extending along a plurality of small memory cell arrays is arranged for one column of memory cells. For this reason, the pitch of the main bit lines can be almost twice that of conventional main bit lines, and capacitances between the bit lines can be reduced.

The width of each main bit line is increased to reduce a bit line resistance, resistances to stressmigration and electromigration can be increased, and the main bit lines can be easily processed. In contrast to this, when the pitch is set to be almost equal to that of conventional main bit lines, the size of each memory cell in the row direction can be reduced, and the area of the memory cells can be reduced.

Of the sub bit lines arranged in the plurality of small memory cell arrays arranged along the main bit lines, only sub bit lines selected by selection transistors are connected to the main bit lines. For this reason, the junction capacitance of the main bit lines is smaller than that obtained when all the plurality of memory cells arranged along the bit lines are connected to the bit lines.

In the semiconductor memory apparatus according to the present invention, one main bit line commonly used for adjacent memory cells is selected by a selection signal to be connected to a sense amplifier. In addition, this selection signal can be obtained from a column address signal. Therefore, the number of sense amplifiers, the number of address data, a bit arrangement architecture, and the like used in a conventional semiconductor memory apparatus can be used without any special change.

In the semiconductor memory apparatus according to the present invention, since the longest data transmission paths extending from the memory cells to the main bit lines are the shortest, the maximum transmission time of the data is shortest.

In the semiconductor memory apparatus according to the present invention, although the pairs of sub bit lines arranged for each column in a small memory cell array must be micropatterned, since the sub bit lines are comprised of a material which contains a refractory metal or its silicide as a main component and can be easily processed, patterning of the sub bit lines can be easily performed. On the other hand, since only almost one of the main bit lines is comprised of a material which contains Al as a main component, has a low resistance but cannot be easily processed, and is arranged for each column of the memory cells, patterning of the main bit lines can also be easily performed.

In the semiconductor memory apparatus according to the present invention, after a memory cell is selected, a sub bit line is kept connected to a main bit line for a predetermined period of time. For this reason, the sub bit line can be charged to have a predetermined voltage through the main bit line. Therefore, when a memory cell is next selected, information stored in the memory cell can be prevented from being broken by the inverse relationship between the information and the voltage of a pair of sub bit lines.

DETAILED DESCRIPTION OF THE PREFERRED EMBODIMENTS

Figure 5A:
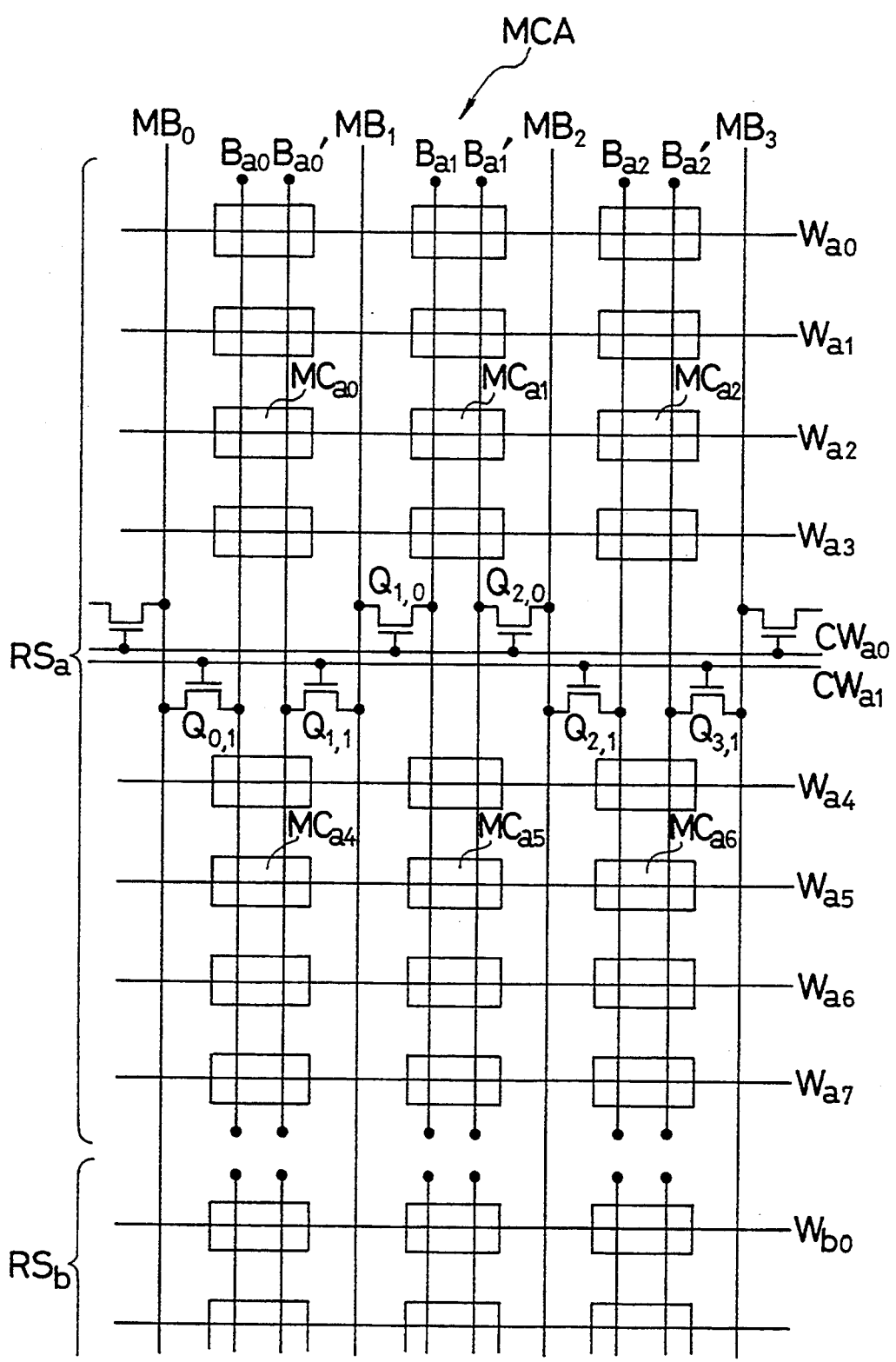
FIG. 5A is a circuit diagram showing a small memory cell array according to the first embodiment of the present invention.

Embodiments of the present invention will be described. The embodiments of the present invention applied to an SRAM having a ×4-bit arrangement will be described below referring to drawings. FIG. 5A shows a memory cell array MCA according to the first embodiment of the present invention. According to this embodiment, memory cells $MC_{a0}$, $MC_{a1}$, ... and word lines $W_{a0}$ and $W_{ab}$, ... have substantially the same arrangement as that of memory cells $MC_0$, $MC_1$, ... and word lines $W_0$ and $W_1$, ... in the related art shown in FIG. 1.

However, in this embodiment, a pair of true and complementary sub bit lines $B_{a0}$ and $B_{a0}'$, ... arranged for each column are connected to only eight memory cells $MC_{a0}$, .... In this manner a group of memory cells $MC_{a0}$, ... connected to the pairs of sub bit lines $B_{a0}$, $B_{a0}'$, ... in each column is called a row section, and a plurality of row sections $RS_a$, $RS_b$, ... are arranged in a column direction. Note that the sub bit lines $B_{a0}$, $B_{a0}'$, ... are comprised of a refractory metal such as tungsten, its silicide, or a polycide obtained by stacking the silicide on a polysilicon film.

Figure 5B:
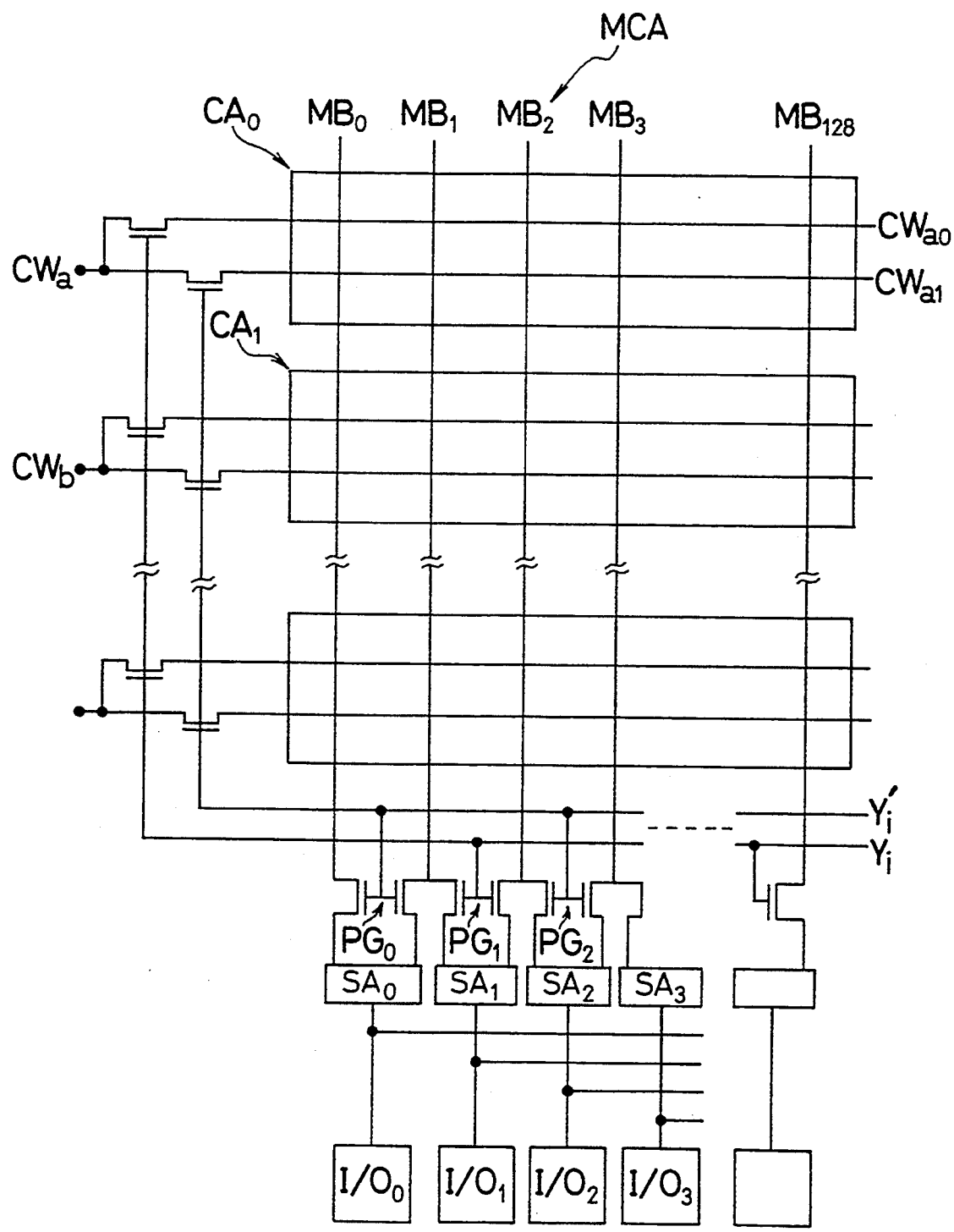
FIG. 5B is a circuit diagram showing the arrangement of small memory cell arrays according to the first embodiment of the present invention.

Main bit lines $MB_0$, $MB_1$, ... comprised of an Al-based alloy are respectively arranged on both sides of the memory cell array MCA and between two adjacent columns of memory cells $MC_{a0}$, .... As shown in FIG. 5B, the main bit lines $MB_0$, $MB_1$, ... adjacent to each other are paired with each other and are connected to sense amplifiers $SA_0$, $SA_1$, ... through pass gates $PG_0$, $PG_1$, ..., respectively. Pairs of column selection word lines $CW_{a0}$, $CW_{a1}$, ... are arranged for the row sections $RS_a$, $RS_b$, ... respectively, so as to cross the central portions of the sub bit lines $B_{a0}$, $B_{a0}'$, ... in their longitudinal direction.

Selection transistors $Q_{0,1}$, $Q_{1,1}$, ... using the column selection word lines $CW_{a0}$, $CW_{a1}$, ... as gate electrodes are arranged at the central portions of the sub bit lines $B_{a0}$, $B_{a0}'$, ... in their longitudinal direction. A pair of sub bit lines, e.g., the sub bit lines $B_{a1}$ and $B_{a1}'$, are connected to the main bit lines $MB_1$ and $MB_2$ through the selection transistors $Q_{1,0}$ and $Q_{2,0}$, respectively, and the sub bit lines $B_{a0}$ and $B_{a2}$ on both the sides of the main bit lines $MB_1$ and $MB_2$ are connected to the main bit lines $MB_1$ and $MB_2$ through the selection transistors $Q_{1,1}$ and $Q_{2,1}$, respectively.

Therefore, when the information of, e.g., the pair of sub bit lines $B_{a1}$ and $B_{a1}'$ is to be transmitted to the main bit lines $MB_1$ and $MB_2$, the column selection line $CW_{a0}$ may be activated to set the selection transistors $Q_{1,0}$ and $Q_{2,0}$ in a conductive state. At this time, since the selection transistors $Q_{1,1}$ and $Q_{2,1}$ are set in a non-conductive state, the information of the sub bit lines $B_{a0}'$ and $B_{a2}$ is not transmitted to the main bit lines $MB_1$ and $MB_2$. That is, the pair of sub bit lines $B_{a1}$ and $B_{a1}'$ and the sub bit lines $B_{a0}'$ and $B_{a2}$ adjacent to the sub bit lines $B_{a1}$ and $B_{a1}'$ and present in the columns on both the sides of the pair of sub bit lines are connected to the main bit lines $MB_1$ and $MB_2$ only electrically exclusively.

FIG. 5B shows the arrangement of a group of the row sections $RS_a$, $RS_b$, ... shown in FIG. 5A. The row sections $RS_a$, $RS_b$, ... correspond to small memory cell arrays $CA_0$, $CA_1$, ..., respectively. Therefore, the memory cell array MCA is divided into the plurality of small memory cell arrays $CA_0$, $CA_1$, ... in the column direction.

The column selection word lines $CW_{a0}$, $CW_{a1}$, ... each pair of which are arranged in a corresponding one of the small memory cell arrays $CA_0$, $CA_1$, ... are branched from a corresponding one of the column selection signal lines $CW_a$, $CW_b$, .... Only one of each pair of column selection word lines $CW_{a0}$ and $CW_{a1}$, ... is activated by a selection signal $Y_i$ or $Y_i'$. Each of the small memory cell arrays $CA_0$, $CA_1$, ... includes $128 \times 8$ memory cells $MC_{a0}$, $MC_{a1}$, ..., and 129 main bit lines $MB_0$, $MB_1$, ... corresponding to 128 bits across the small memory cell arrays $CA_0$, $CA_1$, ... in the column direction.

In this embodiment, although the number of memory cells $MC_{a0}$, ... of each of the memory cell arrays $CA_0$, $CA_1$, ... in the column direction, i.e., the number of the memory cells $MC_{a0}$, ... connected to each pair of the sub bit lines $B_{a0}$, $B_{a0}'$, ..., is set to be 8 for descriptive convenience, a value of 32, 64, or 128 is generally used as the number of memory cells $MC_{a0}$, ....

In the embodiment described above, in operation, a decode signal at the levels of the small memory cell arrays $CA_0$, $CA_1$, ... before a row address signal input to a row address decoder RAD is decoded to the level of each row, is branched into the column selection signal lines $CW_a$, $CW_b$, ..., thereby selecting the small memory cell arrays $CA_0$, $CA_1$, .... In addition, the selection signals $Y_i$ and $Y_i'$ are obtained on the basis of a column address signal input to a column address decoder CAD.

In order to read out the information of, e.g., the memory cell $MC_{a1}$, in the memory cell array MCA, the word line $W_{a2}$ is activated to transmit the information of the memory cell $MC_{a1}$ to the sub bit lines $B_{a1}$ and $B_{a1}'$. The column selection word line $CW_{a0}$ is activated by the selection signal $Y_i$ to transmit the information of the sub bit lines $B_{a1}$ and $B_{a1}'$ to the main bit lines $MB_1$ and $MB_2$ through the selection transistors $Q_{1,0}$ and $Q_{2,0}$, respectively. In addition, the pass gate $PG_1$ is opened by the selection signal $Y_i$ to electrically connect the main bit lines $MB_1$ and $MB_2$ to the sense amplifier $SA_1$. The information of the main bit lines $MB_1$ and $MB_2$ are detected by the sense amplifier $SA_1$.

In the same manner as described above, in order to read out the information of memory cell $MC_{a4}$, the word line $W_{a5}$ is activated to transmit the information of the memory cell $MC_{a4}$ to the sub bit lines $B_{a0}$ and $B_{a0}'$. The column selection word line $CW_{a1}$ is activated by the selection signal $Y_i'$ to transmit the information of the sub bit lines $B_{a0}$ and $B_{a0}'$ to the main bit lines $MB_0$ and $MB_1$ through the selection transistors $Q_{0,1}$ and $Q_{1,1}$, respectively. In addition, the pass gate $PG_0$ is opened by the selection signal $Y_i'$ to electrically connect the main bit lines $MB_0$ and $MB_1$ to the sense amplifier $SA_0$. The information of the main bit lines $MB_0$ and $MB_1$ is detected by the sense amplifier $SA_0$.

Note that, as is apparent from the above description, although the information of the sub bit line $B_{a1}$ and the information of the sub bit line $B_{a0}'$ are transmitted to the main bit line $MB_1$, the information of the sub bit line $B_{a1}$ is transmitted only when the column selection word line $CW_{a0}$ is activated, and the information of the sub bit line $B_{a0}'$ is transmitted only when the column selection word line $CW_{a1}$ is activated. Therefore the information of the sub bit lines $B_{a1}$ and $B_{a0}'$ is not simultaneously transmitted to the main bit line $MB_1$.

When the information of the sub bit line $B_{a1}$ is transmitted to the main bit line $MB_1$, the information of the sub bit line $B_{a1}'$, paired with the sub bit line $B_{a1}$ is transmitted to the main bit line $MB_2$. These main bit lines $MB_1$ and $MB_2$ are electrically connected to the sense amplifier $SA_1$ by the selection signal $Y_1$ through the pass gate $PG_1$. When the information of the sub bit line $B_{a0}'$ is transmitted to the main bit line $MB_1$, the information of the sub bit line $B_{a0}$ paired with the sub bit line $B_{a0}'$ is transmitted to the main bit line $MB_0$. These main bit lines $MB_0$ and $MB_1$ are electrically connected to the sense amplifier $SA_0$ by the selection signal $Y_i'$ through the pass gate $PG_0$.

That is, when the main bit line $MB_1$ is paired with the main bit line $MB_2$, these main bit lines $MB_1$ and $MB_2$ are correctly and electrically connected to the sense amplifier $SA_1$ by the selection signal $Y_i$ through the pass gate $PG_1$. When the main bit line $MB_1$ is paired with the main bit line $MB_0$, these main bit lines $MB_1$ and $MB_0$ are correctly and electrically connected to the sense amplifier $SA_0$ by the selection signal $Y_i'$ through the pass gate $PG_0$.

On the other hand, in order to write information, although the sense amplifiers $SA_0$, $SA_1$, ... are not used, a pair of pieces of selected information are transmitted to the main bit line $MB_0$, $MB_1$, ... through the pass gates $PG_0$, $PG_1$, ... opened by the selection signal $Y_i$ or $Y_i'$. These pieces of information are written in a specific one of the memory cells $MC_{a0}$, $MC_{a1}$, ... in the memory cell array MCA through selection of the column selection word lines $CW_{a0}$, $CW_{a1}$, ... and the word lines $W_{a0}$, $W_{a1}$, ....

Figure 6:
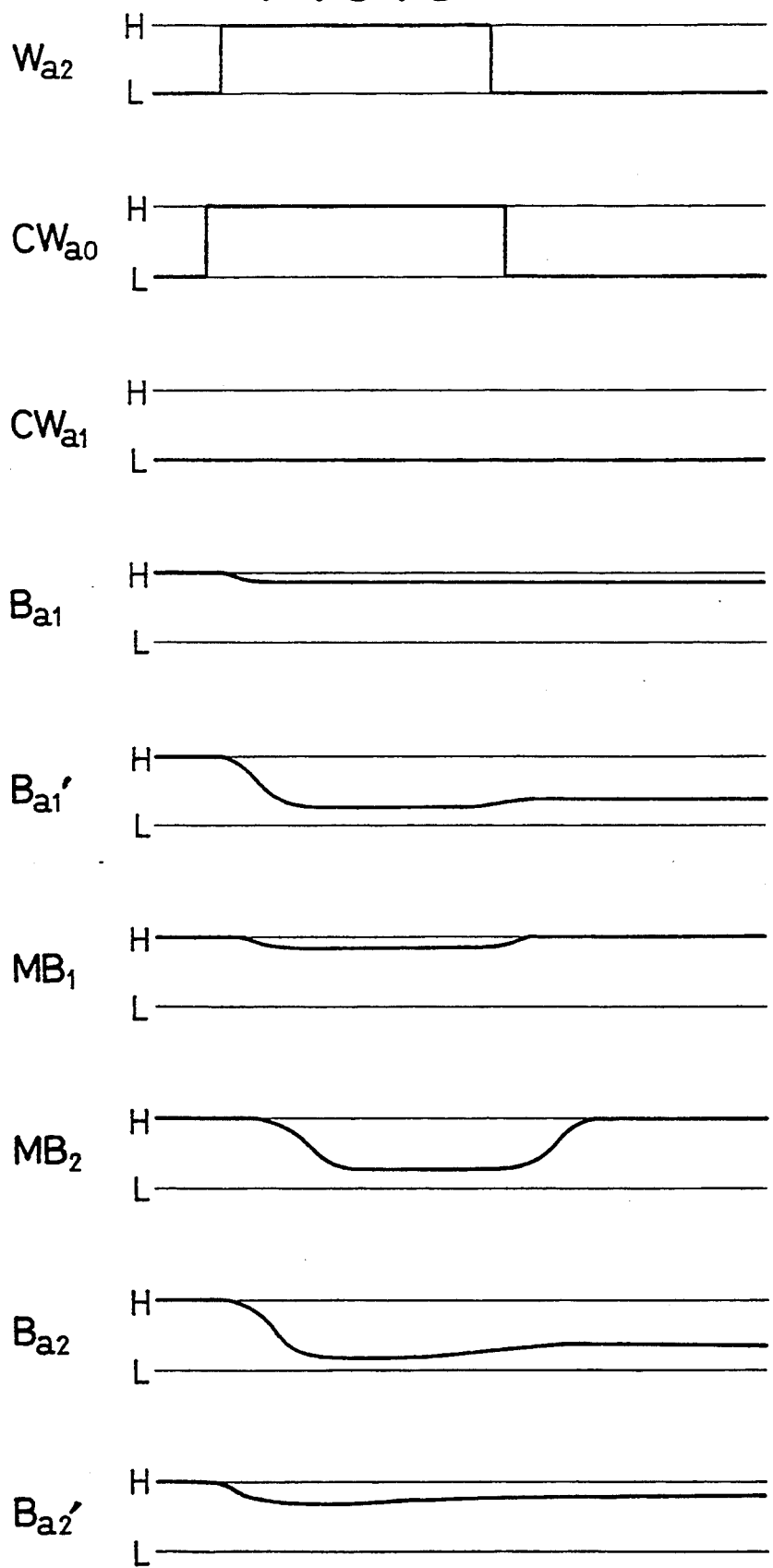
FIG. 6 is a graph showing the timings of signals considered in the first embodiment of the present invention shown in FIGS. 5A and 5B.

For example, when the information of the memory cell $MC_{a1}$ which has values of 1 and 0 corresponding to the sub bit lines $B_{a1}$ and $B_{a1}'$ is to be read out, as shown in FIG. 6, the word line $W_{a2}$ is activated to be set at the H level, the column selection word line $CW_{a0}$ is activated to be set at the H level in correspondence with the period in which the word line $W_{a2}$ is set at the H level and the column selection word line $CW_{a1}$ is kept inactive and kept at the L level. At this time, the sub bit line $B_{a1}$ and the main bit line $MB_1$ go to the H level and the sub bit line $B_{a1}'$ and the main bit line $MB_2$ go to the L level.

Figure 7:
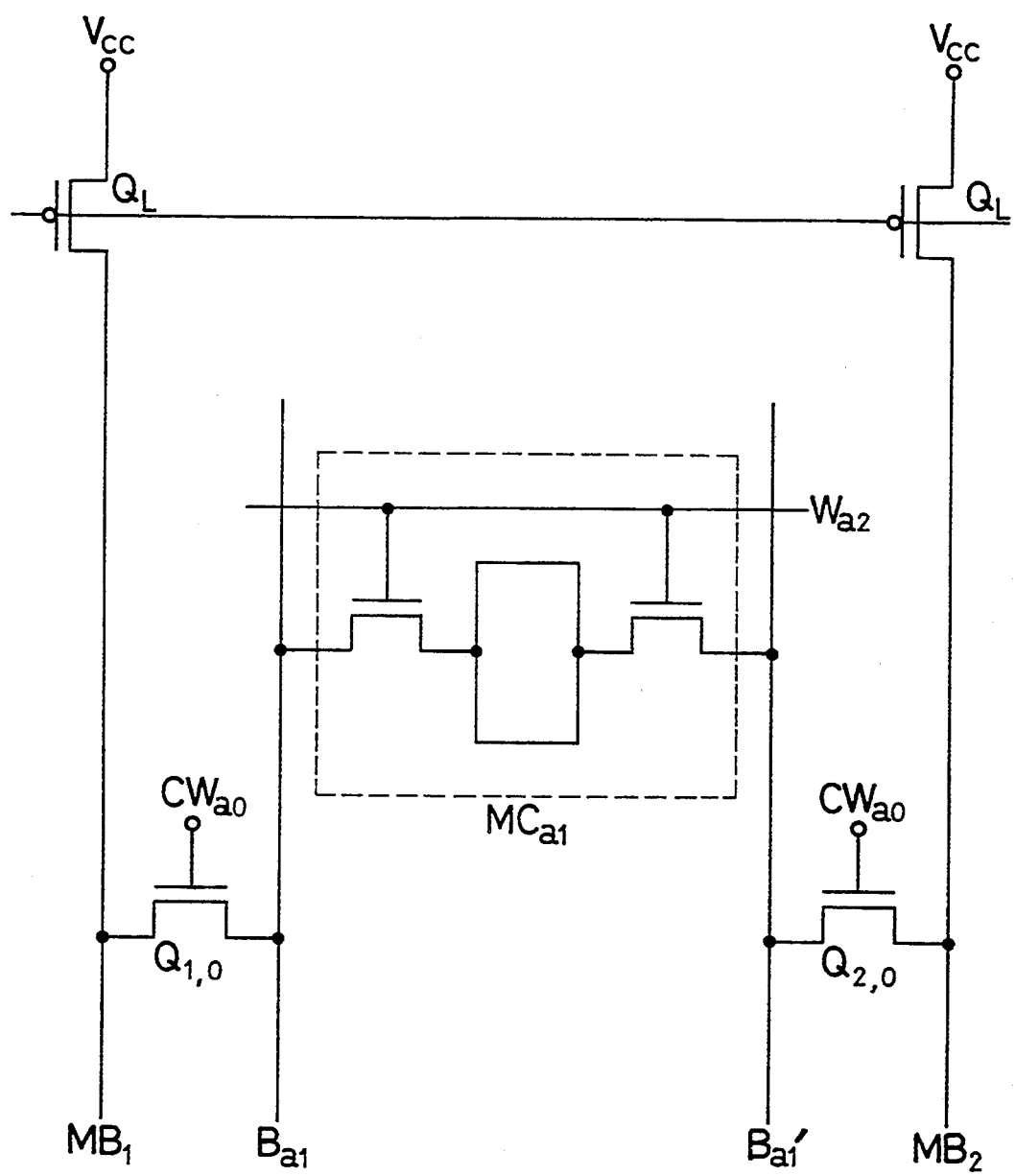
FIG. 7 is a circuit diagram showing the memory cell according to the first embodiment of the present invention.

On the other hand, as shown in FIG. 7, the main bit lines $MB_0$, $MB_1$, ... are generally pulled up (charged) to the level of a power supply voltage ($V_{cc}$) by a bit line load circuit, such as a PMOS transistor $Q_L$. For this reason, after read access of information from the memory cell $MC_{a1}$ is completed, the voltages of the main bit lines $MB_1$ and $MB_2$ are immediately recover to $V_{cc}$.

However, no pull-up circuit is connected to the sub bit lines $B_{a0}$, $B_{a0}'$, ... in this embodiment. For this reason, the information of the memory cell $MC_{a1}$ is left in the sub bit lines $B_{a1}$ and $B_{a1}'$, and information of the other memory cell $MC_{a2}$ and the like arranged along the word line $W_{a2}$ commonly used for the memory cell $MC_{a1}$ is left in the sub bit lines $B_{a2}$ and $B_{a2}'$ and the like. Therefore, assuming that the information of the memory cell $MC_{a2}$ has values of 0 and 1 corresponding to the sub bit lines $B_{a2}$ and $B_{a2}'$, the information is left in the sub bit lines $B_{a2}$ and $B_{a2}'$.

For example, when the word line $W_{a5}$ is activated to read out the information of the memory cell $MC_{a5}$, the information of the memory cell $MC_{a6}$ has values of 1 and 0 corresponding to the sub bit lines $B_{a2}$ and $B_{a2}'$. At this time, the information of the memory cell $MC_{a6}$ may be probably broken by the information having the values of 0 and 1 and left in the sub bit lines $B_{a2}$ and $B_{a2}'$. For this reason according to this embodiment, when the information of the memory cell $MC_1$ is to be read out, the activation timings of the column selection word lines $CW_{a0}$ and $CW_{a1}$, i.e., the timings of the turn-on operations of the selection transistors $Q_{1,0}$, $Q_{2,0}$, ..., are defined as shown in FIG. 8.

Figure 8:
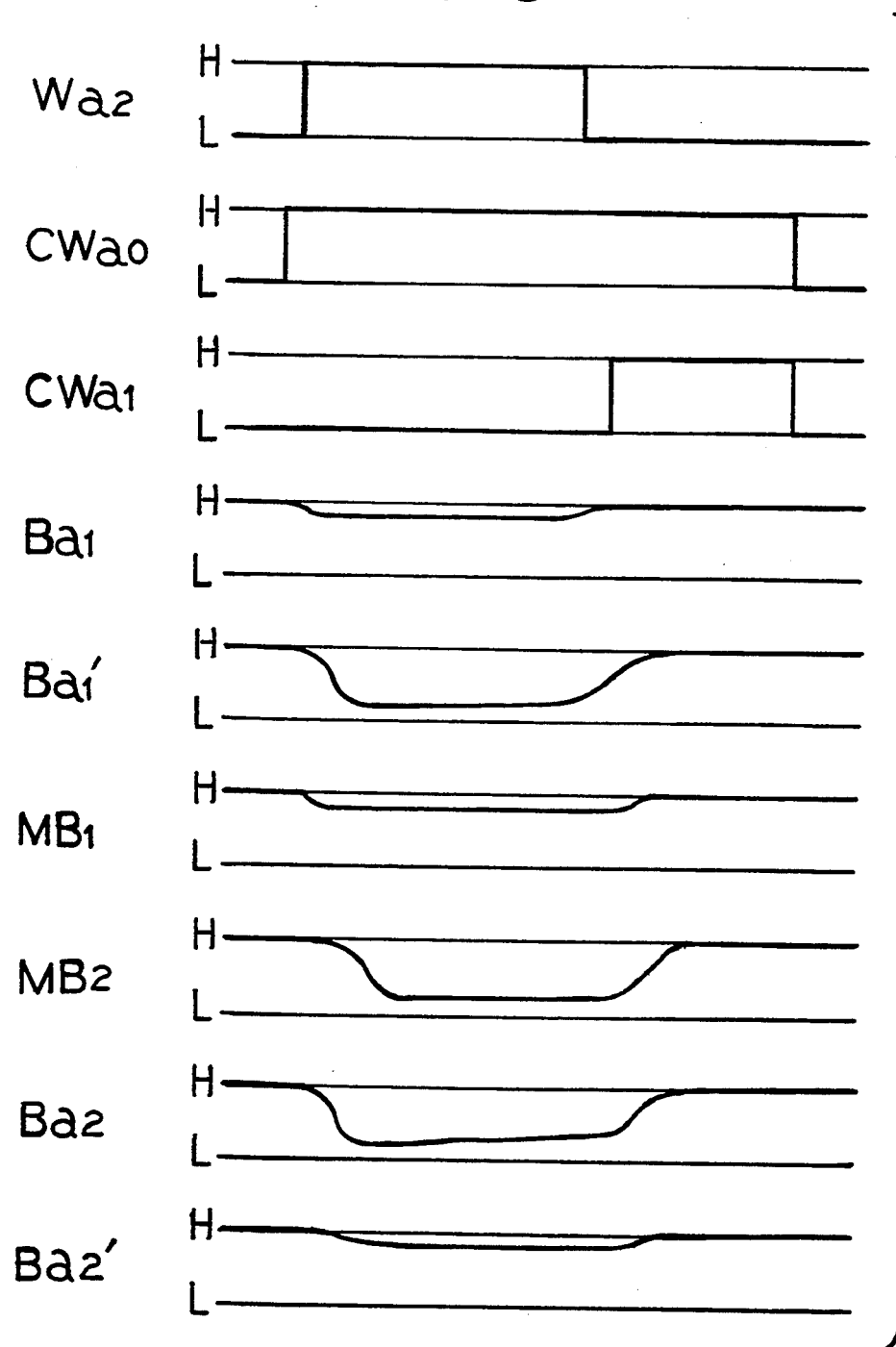
FIG. 8 is a graph showing the timings of the signals in the first embodiment of the present invention.

At the timings shown in FIG. 8, the word line $W_{a2}$ is activated by an address signal for selecting the memory cell $MC_{a1}$ to transmit the information of the memory cell $MC_{a1}$ to the sub bit lines $B_{a1}$ and $B_{a1}'$. In this case, as in the case described in FIG. 6, the sub bit lines $B_{a1}$ and $B_{a1}'$ are set at the H level and the L level, respectively. In addition, as described above, at this time, the levels of the sub bit lines $B_{a2}$ and $B_{a2}'$ and the like are simultaneously changed in accordance with the information of the memory cell $MC_{a2}$ or the like.

The column selection word line $CW_0$ is activated substantially simultaneously with activation of the word line $W_{a2}$ to set the selection transistors $Q_{1,0}$ and $Q_{2,0}$ in a conductive state, thereby transmitting the information of the sub bit lines $B_{a1}$ and $B_{a1}'$ to the main bit lines $MB_1$ and $MB_2$. The information of the main bit lines $MB_1$ and $MB_2$ is detected by the sense amplifier $SA_1$.

Although the word line $W_{a2}$ is inactivated to disconnect the memory cell $MC_{a1}$ from the sub bit lines $B_{a1}$ and $B_{a1}'$, the column selection word line $CW_{a0}$ is still kept in an active state. Although the memory cell $MC_{a1}$ which drops the potential of the sub bit line $B_{a1}'$ is disconnected, the selection transistors $Q_{1,0}$ and $Q_{2,0}$ are kept in a conductive state. For this reason, the sub bit lines $B_{a1}$ and $B_{a1}'$ are charged to $V_{cc}$ through the PMOS transistor $Q_L$ and the main bit lines $MB_1$ and $MB_2$.

After the word line $W_{a2}$ is inactivated, the column selection word line $CW_{a0}$ is kept in an active state, and the column selection word line $CW_{a1}$ is also activated. As a result, the sub bit lines $B_{a2}$ and $B_{a2}'$ are charged to $V_{cc}$ through the PMOS transistor $Q_L$, the main bit lines $MB_2$ and $MB_3$ and the selection transistors $Q_{2,1}$ and $Q_{3,1}$. After all the sub bit lines $B_{a1}$, $B_{a1}'$, $B_{a2}$, $B_{a2}'$, ... are charged to $V_{cc}$, the column selection word lines $CW_{a0}$ and $CW_{a1}$ are inactivated. Thereafter, the corresponding word line and column selection word line are activated by the next address signal.

At the timings shown in FIG. 8, after the memory cells $MC_{a0}$, $MC_{a1}$, ... are selected, the sub bit lines $B_{a0}$, $B_{a0}'$, ... are always charged to $V_{cc}$. For this reason, stored information can be prevented from being broken during the next selection of the memory cells $MC_{a0}$, $MC_{a1}$, ....

At the timings shown in FIG. 8, as is apparent from the above description and FIG. 8, the column selection word lines $CW_{a0}$, $CW_{a1}$, ... are normally set in an inactivate state, and the column selection word lines $CW_{a0}$, $CW_{a1}$, ... corresponding to the addresses of the memory cells $MC_{a0}$, $MC_{a1}$, ... to be selected are activated during the selection of the memory cells $MC_{a0}$, $MC_{a1}$, ....

Figure 9:
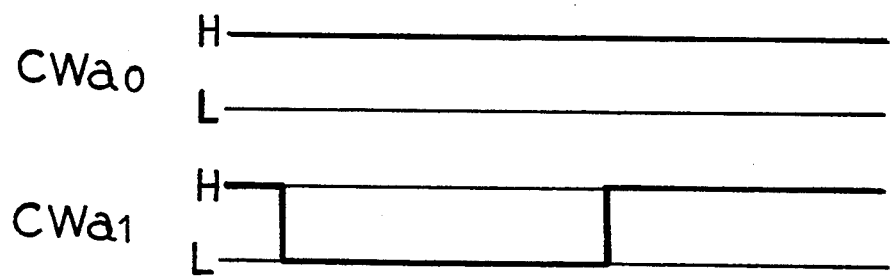
FIG. 9 is a graph showing a modification of the timings of the signals in the first embodiment of the present invention.

As shown in FIG. 9, the column selection word lines $CW_{a0}$, $CW_{a1}$, ... may be normally kept activated, and the column selection word lines $CW_{a0}$, $CW_{a1}$, ... corresponding to the address of the non-selected memory cells $MC_{a0}$, $MC_{a1}$, ... may be inactivated during the selection of the memory cells $MC_{a0}$, $MC_{a1}$, .... In this case, the operations of signals except for the signals of the column selection word lines $CW_{a0}$, $CW_{a1}$, ..., are substantially the same as those shown in FIG. 8.

The sub bit lines $B_{a0}$, $B_{a0}'$, ... of this embodiment, as described above, are comprised of a refractory metal such as tungsten, its silicide, or a polycide obtained by stacking the silicide on a polysilicon film. For this reason, although one pair of sub bit lines $B_{a0}$, $B_{a0}'$, ... are required for each column in each of the row sections $RS_a$, $RS_b$, ..., and the sub bit lines $B_{a0}$, $B_{a0}'$, ... must be micropatterned, the sub bit lines $B_{a0}$, $B_{a0}'$, ... are excellent in workability and reliability. Since the above material has a resistance higher than that of Al, the material has poor signal transmission. However, this does not pose any problem because the sub bit lines $B_{a0}$, $B_{a0}'$, ... have small lengths.

Figure 1:
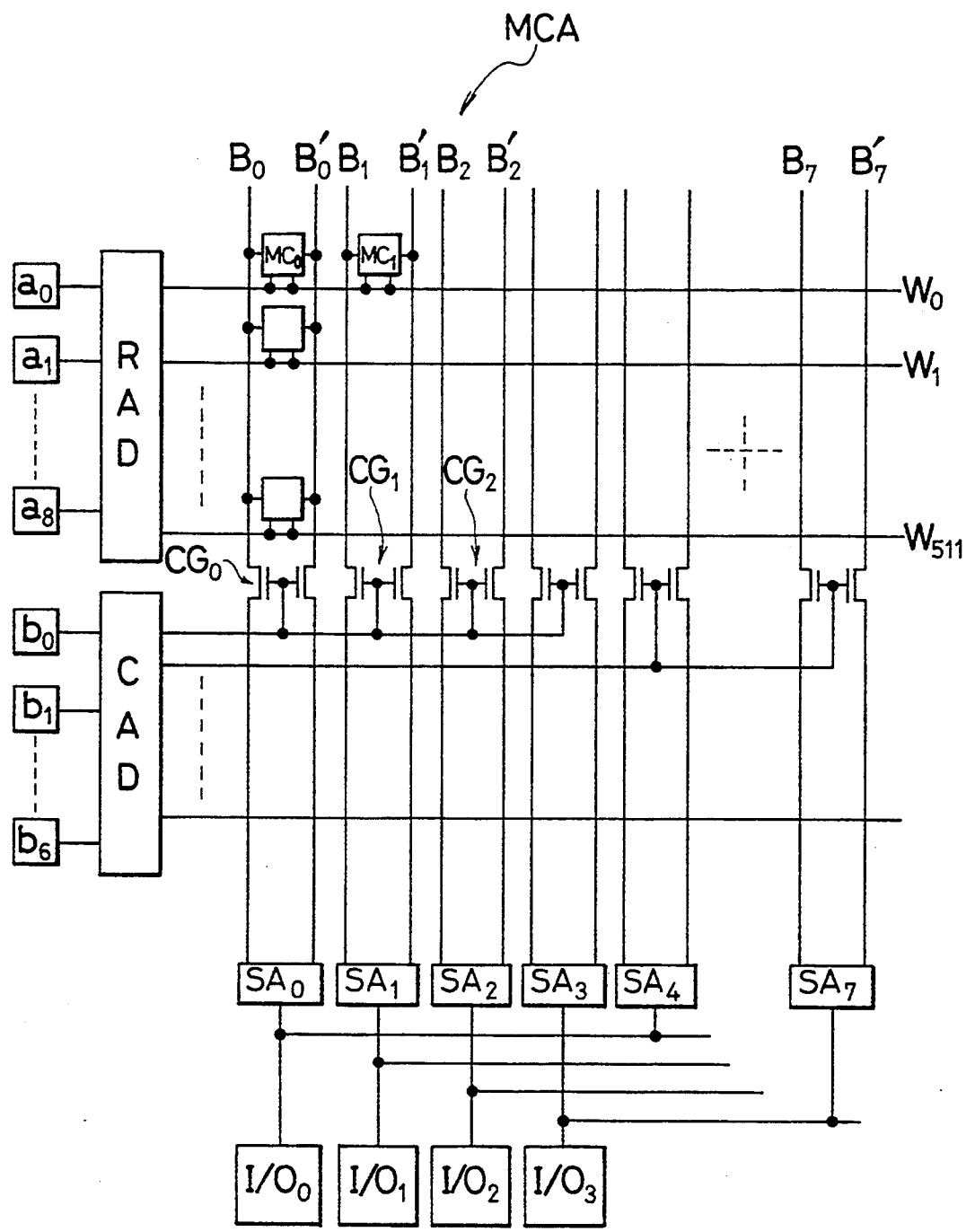
FIG. 1 is a circuit diagram of a related art of an SRAM.
Figure 2:
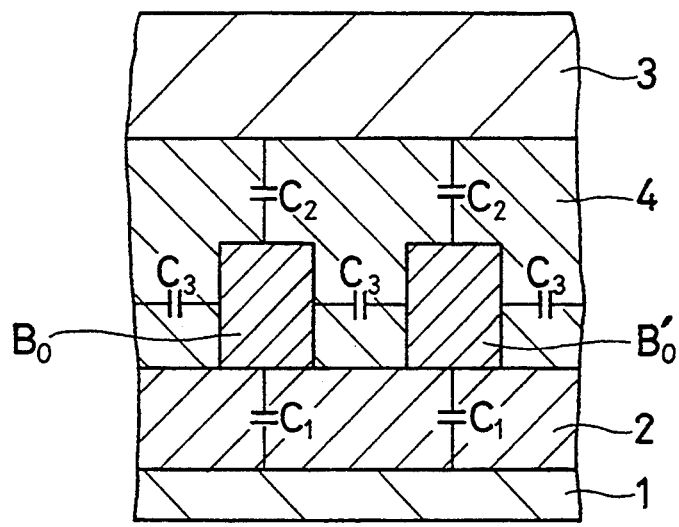
FIG. 2 is a side sectional view for explaining the capacitance of bit lines in the related art.
Figure 3:
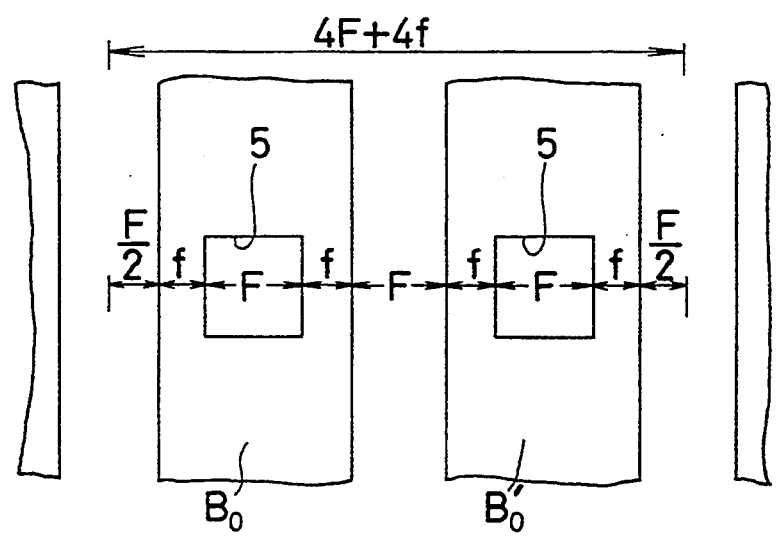
FIG. 3 is a plan view for explaining the size of each memory cell in the related art.

On the other hand, since only one of the main bit lines $MB_0$, $MB_1$, ... is required for each column of the memory cells $MC_{a0}$, $MC_{a1}$, ..., the pitch of the main bit lines $MB_0$, $MB_1$, ... can be set to be substantially twice that of the related art shown in FIG. 1. For this reason, although the main bit lines $MB_0$, $MB_1$, ... are comprised of an Al-based alloy whose reliability with respect to electromigration or stressmigration and workability are degraded with a decrease in line width, the main bit lines $MB_0$, $MB_1$, ... can have a low resistance and transmit signals at high speed without these problems occurring.

Figure 4:
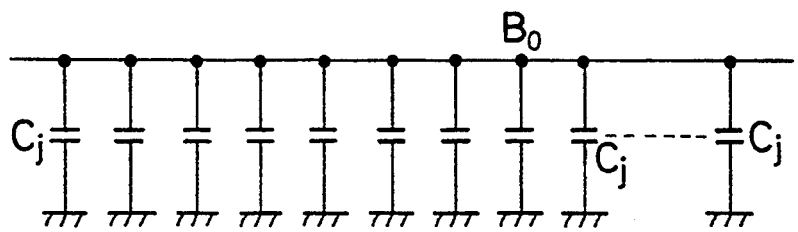
FIG. 4 is a circuit diagram showing the connection state between a bit line and memory cells in the related art.
Figure 11:
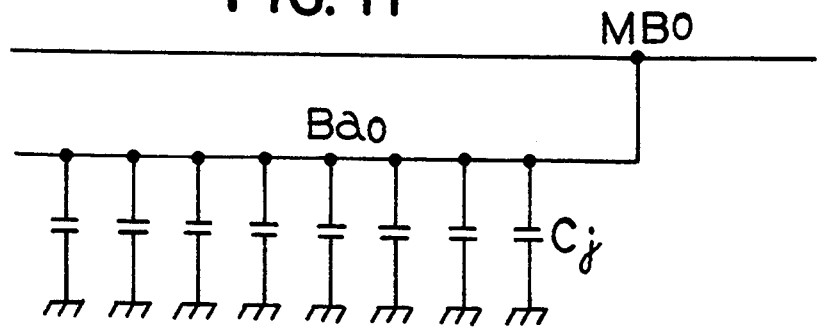
FIG. 11 is a circuit diagram showing a connection state of a main bit line and memory cells in the second embodiment of the present invention.

Since only one of the sub bit lines $B_{a0}$, $B_{a0}'$, ..., is electrically connected to one of the main bit lines $MB_0$, $MB_1$, ..., as shown in FIG. 11, only the memory cells $MC_{a0}$, ... of one column of each of the row sections $RS_a$, $RS_b$, ... are electrically connected to one of the main bit lines $MB_0$, $MB_1$, .... For this reason, the junction capacitance of the main bit lines $MB_0$, $MB_1$, ... is smaller than that in the related art in which all the memory cells $MC_0$, $MC_1$, ... of each column are connected to the bit lines $B_0$, $B_0'$, ... as shown in FIG. 4. Therefore, high-speed signal transmission can be realized.

In order to reduce only the junction capacitance of the main bit lines $MB_0$, $MB_1$, ... as shown in FIG. 11, one pair of main bit lines $MB_0$, $MB_1$, ... may be arranged for each column. In this case, although the pitch of the main bit lines $MB_0$, $MB_1$, ... is equal to the pitch of the sub bit lines $B_{a0}$, $B_{a0}'$, ..., the connection between the main bit lines $MB_0$, $MB_1$, ... and the sense amplifiers $SA_0$, $SA_1$, ... need not be selected by the selection signals $Y_i$ and $Y_i'$ and the pass gates $PG_0$, $PG_1$, ....

Figure 10:
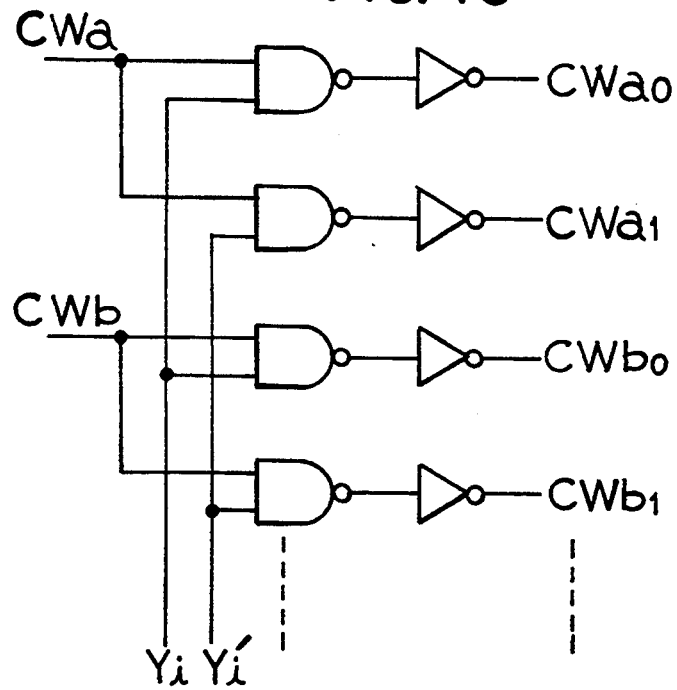
FIG. 10 is a circuit diagram showing column selection word lines according to the second embodiment of the present invention.

The second embodiment of the present invention will be described below. In the first embodiment described above, for descriptive convenience, transistors are connected in series with the column selection word lines $CW_{a0}$, $CW_{a1}$, ..., and these column selection word lines $CW_{a0}$, $CW_{a1}$, ... are selected by a switching operation performed by the selection signals $Y_i$ and $Y_i'$. However, only when the transistors are connected in series with the column selection word lines $CW_{a0}$, $CW_{a1}$, ..., are the potentials of the column selection word lines $CW_{a0}$, $CW_{a1}$, ... dropped by the threshold voltages of the transistors, and the current driver capability of the selection transistors $Q_{0,1}$, $Q_{1,1}$, ... shown in FIG. 5A is degraded. Therefore, a method, for example, using NAND circuits and NOT circuits as shown in FIG. 10 is more practical.

In the above embodiment, as in the related art, word lines are selected by a row address signal input to a row address decoder RAD. Therefore, in addition to the divided bit line method of this embodiment, a conventionally known divided word line method can be employed.

In a semiconductor memory apparatus according to the present invention, a capacitance between bit lines can be reduced, the junction capacitance of the bit lines is small, and a bit line resistance can be reduced. For this reason, a time required for the charging/discharging operations of the bit lines is short, and the operation can be performed at high speed. In addition, since resistances to stressmigration and electromigration can be increased, reliability can be improved. Since the bit lines can be easily processed, yield can be increased, and a memory cell area can be reduced. For this reason, a degree of integration can be increased.

In the semiconductor memory apparatus according to the present invention, the number of sense amplifiers, the number of address data, bit arrangement architecture, and the like used in a conventional semiconductor memory apparatus can be used without any special change. For this reason, the semiconductor memory apparatus according to the present invention can be easily manufactured.

In the semiconductor memory apparatus according to the present invention, since the maximum transmission time of data is shortest, data can be transmitted at high speed.

In the semiconductor memory apparatus according to the present invention, main bit lines and sub bit lines can be easily patterned. For this reason, the semiconductor memory apparatus can be easily manufactured.

In the semiconductor memory apparatus according to the present invention, after a memory cell is selected, when a memory cell is next selected, information stored in the memory cell can be prevented from being broken by the inverse relationship between the information and the voltage of a pair of sub bit lines. Therefore, the semiconductor memory apparatus can have high reliability.

Although various minor changes and modifications might be proposed by those skilled in the art, it will be understood that I wish to include within the scope of the patent warranted hereon all such changes and modifications as reasonably come within my contribution to the art.

What is claimed is:

1. A semiconductor memory apparatus, comprising:
   memory cells formed of flip-flops, and a memory cell array in which a plurality of said memory cells are arranged in rows and columns;
   said memory cell array being divided into a plurality of small memory cell arrays along a direction of said columns;
   a respective main bit line being arranged between all directly adjacent columns of said memory cells along said plurality of small memory cell arrays and also alongside and outwardly of outermost columns of said memory cells at opposite sides of said small memory cell arrays;
   a pair of sub-bit lines being arranged in each of the columns in said small memory cell arrays; and
   at each of said columns, respective selection transistors for connecting the pair of sub-bit lines to said main bit lines flanking each column exclusively of the pair of sub-bit lines in the directly adjacent column at opposite sides of each column.

2. An apparatus according to claim 1 wherein each pair of main bit lines on both sides of each column are connected by devices controlled by selection signals to a respective sense amplifier corresponding to each column.

3. An apparatus according to claim 1 wherein said main bit lines are connected through said selection transistors to the respective sub-bit lines at a central location of said sub-bit lines in each small memory cell array.

4. An apparatus according to claim 1 wherein said main bit lines are comprised of a material containing Al as a main component, and said sub-bit lines are comprised of a main component material comprising one of the elements selected from the group consisting of a refractory metal and a silicide of a refractory metal.

5. An apparatus according to claim 1 wherein first and second word lines run through each of said small memory cell arrays with each word line connecting to control the selection transistors of alternate columns of the memory cells.

6. An apparatus according to claim 5 wherein means is provided for activating the word line to select memory cells such that the activated word line sets respective selection transistors connected thereto in a conductive state for a predetermined time when said word line is activated, and means for keeping said selection transistors in a non-conductive state until respective ones of said selection transistors are placed in the conductive state when the respective word line is activated.

7. An apparatus according to claim 5 wherein means is provided for keeping the selection transistors in a conductive state, and means is provided for activating a respective word line to select memory cells such that the activated word line sets respective selection transistors to which it is connected in a non-conductive state.

8. A semiconductor memory apparatus, comprising:

memory cells formed of flip-flops, and a memory cell array in which a plurality of said memory cells are arranged in rows and columns;

said memory cell array being divided into a plurality of small memory cell arrays along a direction of said columns;

a respective main bit line being arranged between all directly adjacent columns of said memory cells along said plurality of small memory cell arrays and also alongside and outwardly of outermost columns of said memory cells at opposite sides of said small memory cell arrays;

a pair of sub-bit lines being arranged in each of the columns in said small memory cell arrays;

first and second word lines running across each small memory cell array in a direction of said rows; and at each of said columns, a pair of selection transistors for connecting the pair of sub-bit lines to said main bit lines flanking each column, and wherein the first word line is connected to control the selection transistors in alternate columns and the second word line is connected to control the selection transistors in remaining alternate columns.

* * * * *